US006628534B2

(12) United States Patent
Benton

(10) Patent No.: US 6,628,534 B2
(45) Date of Patent: Sep. 30, 2003

(54) METHOD AND APPARATUS FOR IMPROVING VOLTAGE TO CURRENT SIGNAL CONVERSION

(75) Inventor: Roger K. Benton, Edenberg (GB)

(73) Assignee: Legrity, Inc., Austin, TX (US)

( * ) Notice: Subject to any disclaimer, the term of this patent is extended or adjusted under 35 U.S.C. 154(b) by 109 days.

(21) Appl. No.: 09/778,129

(22) Filed: Feb. 6, 2001

(65) Prior Publication Data

US 2002/0105817 A1 Aug. 8, 2002

(51) Int. Cl.[7] .......................... H02M 7/00; H03M 1/66; H03F 3/45
(52) U.S. Cl. .......................... 363/73; 330/254; 341/145
(58) Field of Search ............................. 363/73; 341/136, 341/144, 145; 330/254

(56) References Cited

U.S. PATENT DOCUMENTS 4,300,101 A * 11/1981 Shvartsman et al. ........ 330/254
6,246,351 B1 * 6/2001 Yilmaz ....................... 341/145

* cited by examiner

Primary Examiner—Jessica Han
(74) Attorney, Agent, or Firm—Williams Morgan & Amerson, P.C.

(57) ABSTRACT

A method and apparatus is provided for converting a voltage signal into a current signal. A differential circuit is used to convert a voltage signal into a current signal. The differential circuit comprises at least one feedback amplifier to reduce non-linearity in the differential circuit.

17 Claims, 7 Drawing Sheets

METHOD AND APPARATUS FOR IMPROVING VOLTAGE TO CURRENT SIGNAL CONVERSION

BACKGROUND OF THE INVENTION

1. Field of the Invention

This invention relates generally to analog signal processing, and, more particularly, to improving conversion of voltage signals into current signals.

2. Description of the Related Art

In communications systems, particularly telephony such as a Plain Old Telephone System (POTS), it is common practice to transmit signals between a subscriber station and a central switching office via a two-wire, bi-directional communication channel. A line card generally connects the subscriber station to the central switching office. The functions of the line card include supplying talk battery, performing wake-up sequences of circuits to allow communications to take place, and the like. There are a plurality of signals that are sent and received in a voltage-signal format. Many times, these voltage signals are converted to current signals before being processed.

POTS was designed primarily for voice communication, and thus provides an inadequate data transmission rate for many modem applications. To meet the demand for high-speed communication, designers have sought innovative and cost-effective solutions that would take advantage of the existing network infrastructure. Several technological solutions proposed in the telecommunications industry use the existing network of telephone wires. A promising one of these technologies is the xDSL technology.

xDSL is making the existing network of telephone lines more robust and versatile. Once considered virtually unusable for broadband communications, an ordinary twisted pair equipped with DSL interfaces can transmit video, television, and very high-speed data. The fact that more than six hundred million telephone lines exist around the world is a compelling reason for these lines to be used as the primary transmission conduits for at least several more decades. Because DSL utilizes telephone wiring already installed in virtually every home and business in the world, it has been embraced by many as one of the more promising and viable options.

There are now at least three popular versions of DSL technology, namely Asymmetrical Digital Subscriber Line (ADSL), Very High-Speed Digital Subscriber Line (VDSL), and Symmetric Digital Subscriber Line (SDSL). Although each technology is generally directed at different types of users, they all share certain characteristics. For example, all four DSL systems utilize the existing, ubiquitous telephone wiring infrastructure, deliver greater bandwidth, and operate by employing special digital signal processing. Because the aforementioned technologies are well known in the art, they will not be described in detail herein.

DSL and POTS technologies can co-exist in one line (e.g., also referred to as a "subscriber line"). Traditional analog voice band interfaces use the same frequency band, 0–4 Kilohertz (KHz), as telephone service, thereby preventing concurrent voice and data use. A DSL interface, on the other hand, operates at frequencies above the voice channels, from 25 KHz to 1.1 Megahertz (MHz). Thus, a single DSL line is capable of offering simultaneous channels for voice and data. It should be noted that the standards for certain derivatives of ADSL are still in definition as of this writing, and therefore are subject to change.

DSL systems use digital signal processing (DSP) to increase throughput and signal quality through common copper telephone wire. It provides a downstream data transfer rate from the DSL Point-of-Presence (POP) to the subscriber location at speeds of up to 1.5 mega-bits per second (MBPS). The transfer rate of 1.5 MBPS, for instance, is fifty times faster than a conventional 28.8 kilobits per second (KBPS).

DSL systems generally employ a signal detection system that monitors the telephone line for communication requests. More specifically, the line card in the central office polls the telephone line to detect any communication requests from a DSL data transceiver, such as a DSL modem, located at a subscriber station. There are multiple types of signals that are received and transmitted over multiple signal paths during telecommunication operation. Many times it is advantageous to transmit signals in a voltage format, such as to reduce transmission power consumption. However, it is often desirable to convert the voltage signal to current signals before processing the signals. One advantage of processing current signals instead of voltage signals is reduced distortion levels and reduced voltage swings.

Turning now to FIG. 1, one example of a prior art circuit for converting a voltage signal into a current signal, is illustrated. The circuit illustrated in FIG. 1 is a differential circuit, which converts a voltage signal $V_1$ into a current signal, $I_{out}$. The voltage at node 10 is equal to the input voltage $V_1$. The voltage at node 11, $V_2$, is a voltage level that differs from the input voltage by $\Delta V$, where $\Delta V$ is:

$$\Delta V = V_1 - V_2.$$

Ideally, the input voltage $V_1$ is converted to the output current $I_{out}$, proportional to $V_1$, as defined by the equation:

$$I_{out} = V_1/R.$$

However, due to non-linearites that are typically present in devices such as transistors Q1 and Q2, $I_{out}$ generally does not equal to $V_1$ divided by R. The current flow through Q1 (through a line 7) is approximately equal to $$[I/2] + \Delta I.$$

The current flow through Q2 (through a line 9) is approximately equal to $$[I/2] - \Delta I.$$

$\Delta I$ ideally can be defined by the equation $$\Delta I = \Delta V/[2*R].$$

However, the transistors Q1 and Q2, which in one embodiment are bi-polar junctions transistors (BJT), contain an inherent resistance at the emitter 17, called the emitter resistance ($R_{eQ1}$, $R_{eQ2}$). Therefore, in reality, the current differential, $\Delta I$, is equal to $$\Delta V/[2*(R + R_{eQ1})].$$

Due to the non-linear effects of the transistors Q1, Q2 shown in FIG. 1, to receive acceptable signal integrity when converting a voltage signal to a current signal, the current $I_{out}$ has to be much greater than the voltage differential $\Delta V$ divided by $2*R$ $$(\text{i.e.}, I_{out} >> \Delta V/[2*R]).$$

If small-level signals are used, the non-linear effects of the transistors, Q1, Q2 (i.e. effects such as the emitter resistance causing variations in the voltage), can cause significant noise-levels in the converted signal. Furthermore, it is often desirable to process small-level signals in communication circuits.

When large-level voltage signals are converted to large-level current signals, the non-linear effects of the transistor are reduced. However, using large-level signals consumes more power in electronic circuitry. Furthermore, large level signals that are sent through amplification circuits tend to cause a larger amplification of noise levels, resulting in large overall noise levels.

The present invention is directed to overcoming, or at least reducing the effects of, one or more of the problems set forth above.

SUMMARY OF THE INVENTION

In one aspect of the present invention, an apparatus is provided for converting a voltage signal into a current signal. A differential circuit is used to convert a voltage signal into a current signal. The differential circuit comprises at least one feedback amplifier to reduce non-linearity in the differential circuit.

In another aspect of the present invention, an apparatus is provided for converting a voltage signal into a current signal. The apparatus comprises: a first circuit capable of driving a signal onto a subscriber line; and a second circuit electrically coupled with the first circuit portion, wherein the second circuit comprising at least one feedback amplifier to reduce non-linearity when converting at least one voltage signal into a current signal.

In yet another aspect of the present invention, a method is provided for converting a voltage signal into a current signal. At least one voltage signal is converted into a current signal using a differential circuit comprising a plurality of transistors. A feedback is performed using a feedback amplifier to reduce non-linearity of the transistors during the conversion of the voltage signal.

BRIEF DESCRIPTION OF THE DRAWINGS

The invention may be understood by reference to the following description taken in conjunction with the accompanying drawings, in which like reference numerals identify like elements, and in which.

Figure 1:
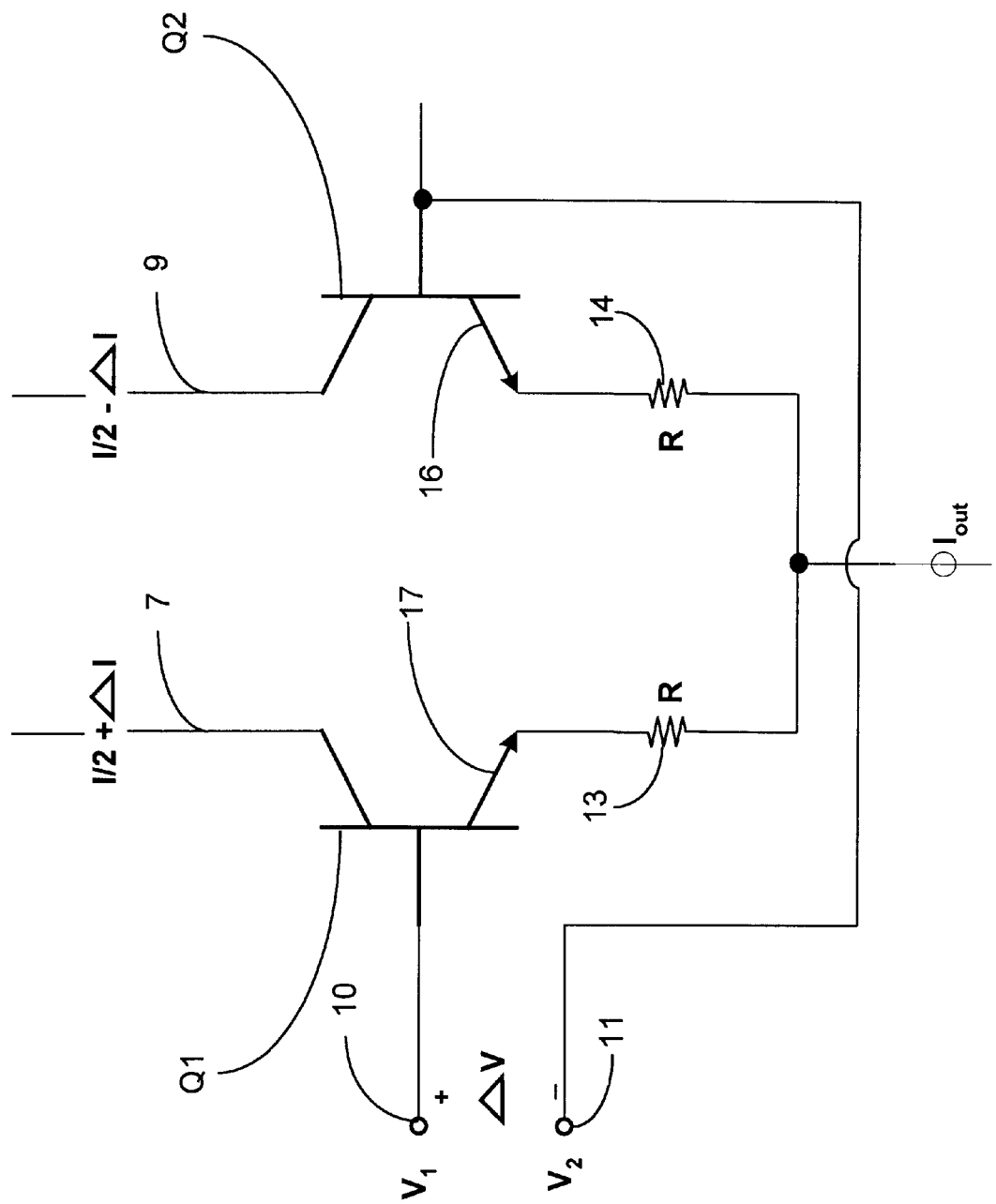
FIG. 1 illustrates a prior art circuit that is capable of converting a voltage signal into a current signal.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Embodiments of the present invention provide for a method and apparatus for reducing the effects of non-linearity typically present in transistors. Embodiments of the present invention provide for utilizing an amplified feedback signal. The method and apparatus taught by the present invention can by utilized in a variety of electronic applications, such as communication circuitry. Although embodiments of the present invention are described within the context of communication circuitry, the teachings of the present inventions can be utilized in a variety of electronic circuits.

Figure 2:
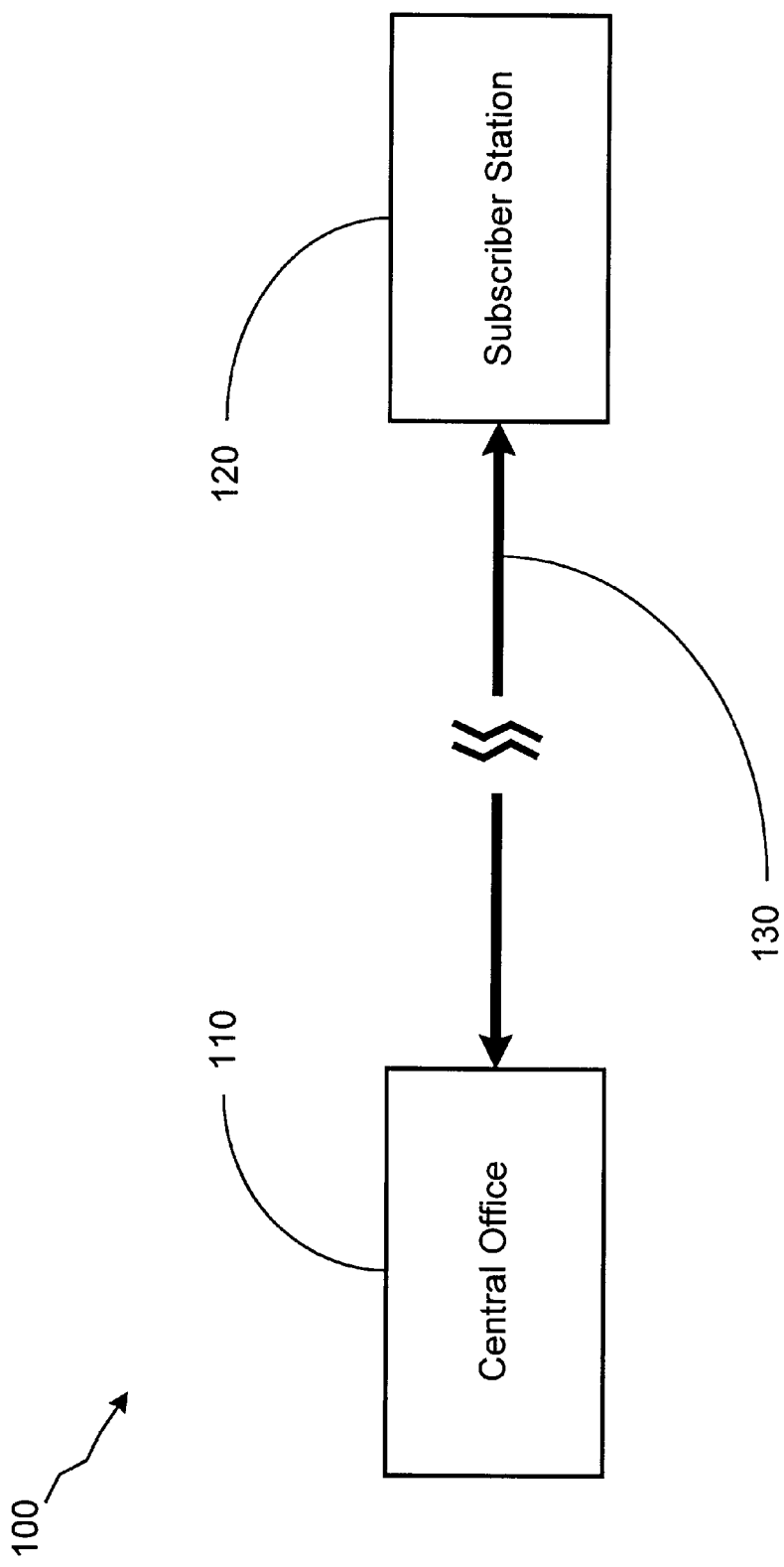
FIG. 2 illustrates a first embodiment of an apparatus in accordance with the present invention.

Referring now to the drawings, and in particular to FIG. 2, an apparatus 100 in accordance with the present invention is illustrated. The apparatus 100 in FIG. 1 includes a central office 110 that is coupled a subscriber station 120 via a subscriber line 130. The central office 110 and the subscriber station 120 are capable of sending and receiving a signal comprising voice and data band. The voice band, as used herein, refers to a POTS voice signal ranging from 0–4 KHz. The data band refers to frequencies above the voice band, and may include, for example, the frequency range employed in xDSL technologies. In one embodiment, the subscriber line 130 may be a Public Switched Telephone Network (PSTN) line, a Private Branch Exchange (PBX) line, or any other medium capable of transmitting signals.

The subscriber station 120 may be a telephonic device capable of supporting pulse dialing. The term "telephonic device," as utilized herein, includes a telephone, or any other device capable of providing a communication link between at least two users. In one embodiment, the subscriber station 120 may be one of a variety of available conventional telephones, such as wired telephones and similar devices. In an alternative embodiment, the subscriber station 120 may be any "device" capable of performing a substantially equivalent function of a conventional telephone, which may include, but is not limited to, transmitting and/or receiving voice and data signals. Examples of the subscriber station 120 include a data processing system (DPS) utilizing a modem to perform telephony, a television phone, a wireless local loop, a DPS working in conjunction with a telephone, Internet Protocol (IP) telephony, and the like. IP telephony is a general term for the technologies that use the Internet Protocol's packet-switched connections to exchange voice, fax, and other forms of information that have traditionally been carried over the dedicated circuit-switched connections of the public switched telephone network (PSTN). One example of IP telephony is an Internet Phone, a software program that runs on a DPS and simulates a conventional phone, allowing an end user to speak through a microphone and hear through DPS speakers. The calls travel over the Internet as packets of data on shared lines, avoiding the tolls of the PSTN.

Figure 3:
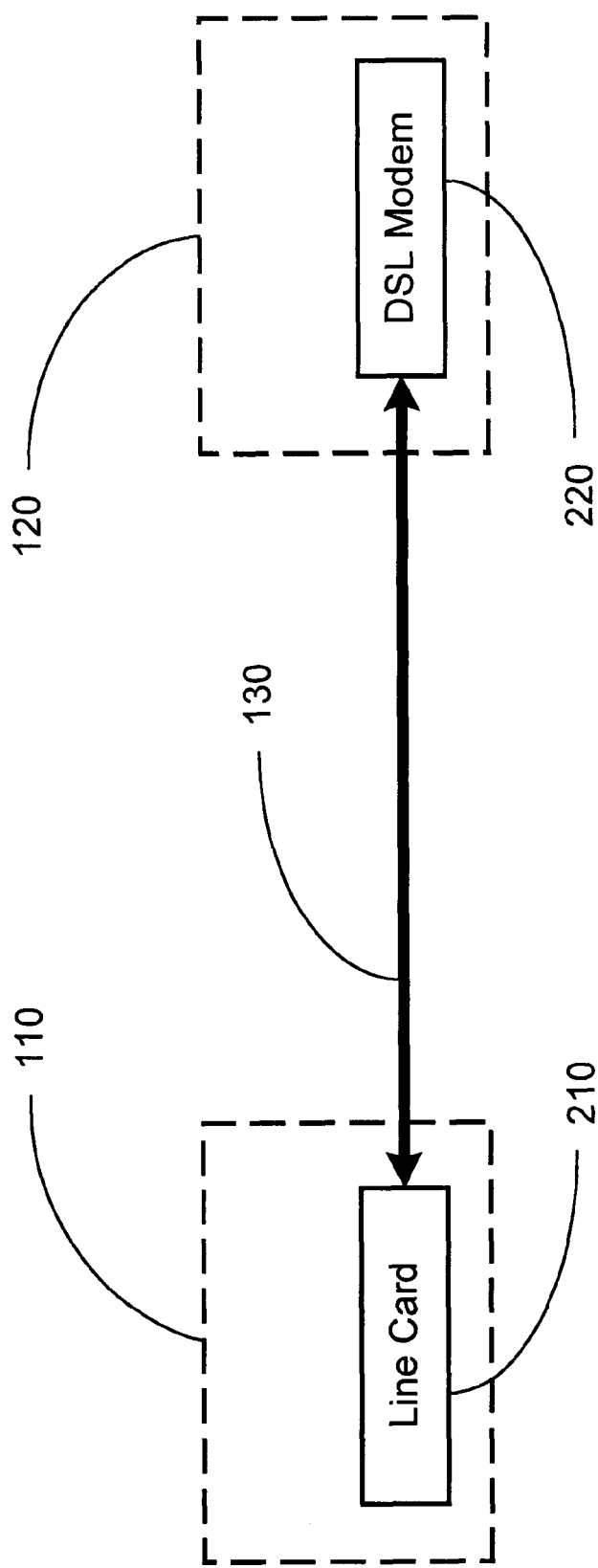
FIG. 3 illustrates an implementation of a line card into the apparatus described in FIG. 2.

Turning now to FIG. 3, a line card 210 and a DSL modem 220 are illustrated in accordance with the present invention. In one embodiment, the line card 210, which is integrated into the central office 110, is coupled with the DSL modem 220, which resides within the subscriber station 120. Because voice and/or data can be transmitted on the subscriber line 130, the signal received and transmitted by the line card 210 and the DSL modem 220 may include voice and data band frequencies.

The line card 210 may be located at a central office or a remote location somewhere between the central office and the subscriber station 120 (see FIG. 2). The line card 210 services the subscriber station 120, which in the illustrated embodiment is a telephonic device. The line card 210 is capable of processing DC voltage signals and AC signals. The subscriber line 130 in the instant embodiment is a telephone line. The combination of the telephone device 120 and the telephone line 130 is generally referred to as a subscriber loop.

The line card 210, which may be capable of supporting a plurality of subscriber lines 130, performs, among other things, two fundamental functions: DC loop supervision and DC feed. The purpose of DC feed is to supply enough power to the telephone device 120 at the customer end. The purpose of DC loop supervision is to detect changes in DC load, such as on-hook events, off-hook events, rotary dialing, or any other event that causes the DC load to change. In the interest of clarity and to avoid obscuring the invention, only that portion of the line card 210 that is helpful to the understanding of the invention is illustrated.

Figure 4:
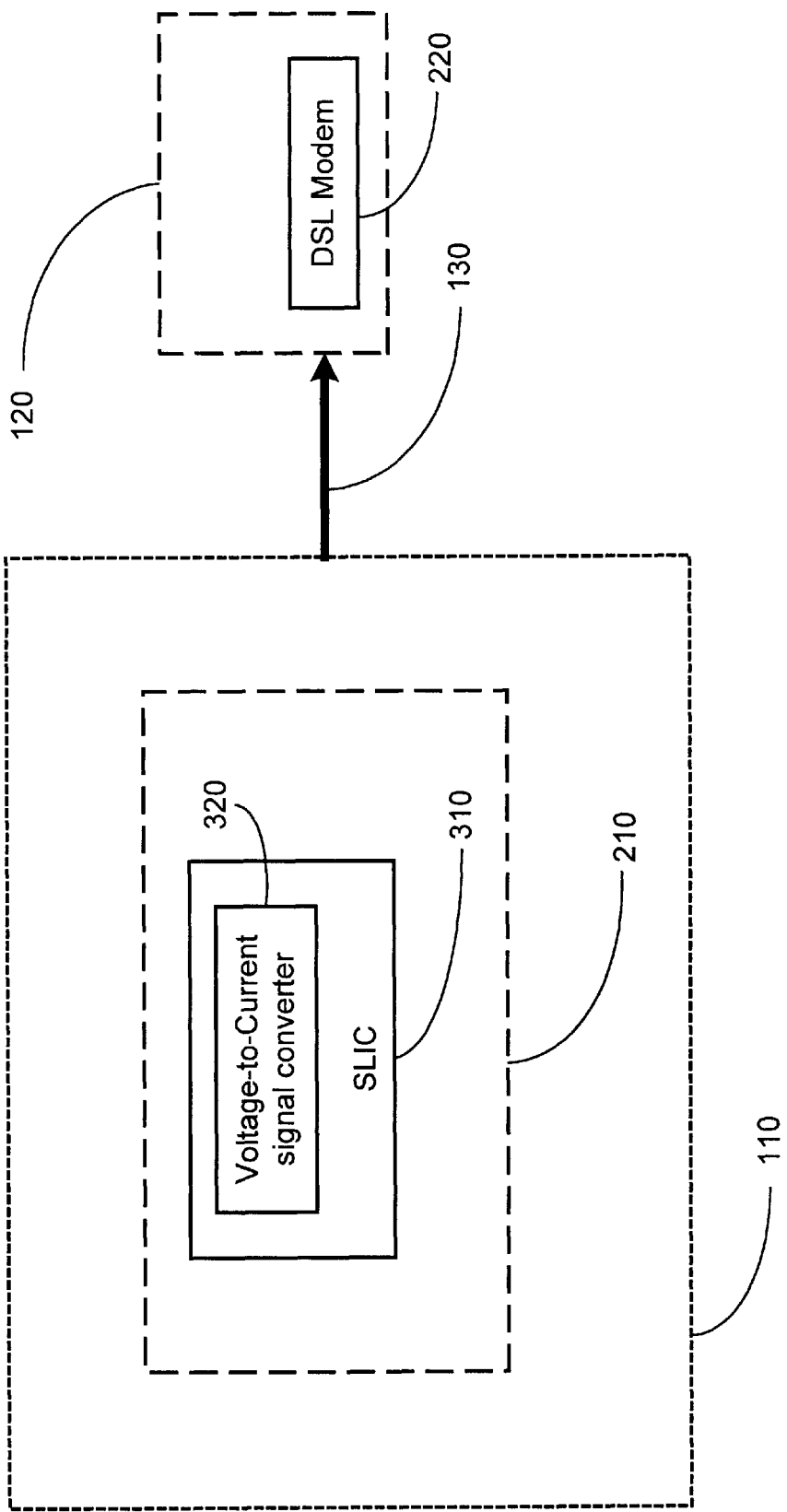
FIG. 4 illustrates a more detailed depiction of the apparatus in accordance with one embodiment of the present invention.

Turning now to FIG. 4, one embodiment of an implementation of a voltage-to-current signal converter 320, as taught by the present invention, is illustrated. In one embodiment, the line card 210 comprises a subscriber line interface circuit (SLIC) 310. The SLIC 310 is capable of performing a variety of functions, such as signal gain functions, battery feed, overload protection, polarity reversal, on-hook transmission, current limiting, and the like.

In one embodiment, the SLIC 310 comprises a voltage-to-current signal converter 320 that is capable of converting voltage signals to current signals. In one embodiment, the voltage-to-current signal converter 320 converts to a current signal, a plurality of voltage signals in both directions, the upstream direction (i.e. from the subscriber station 120 to the central office 110) and the downstream direction (i.e. from the central office 110 to the subscriber station 120).

Figure 5:
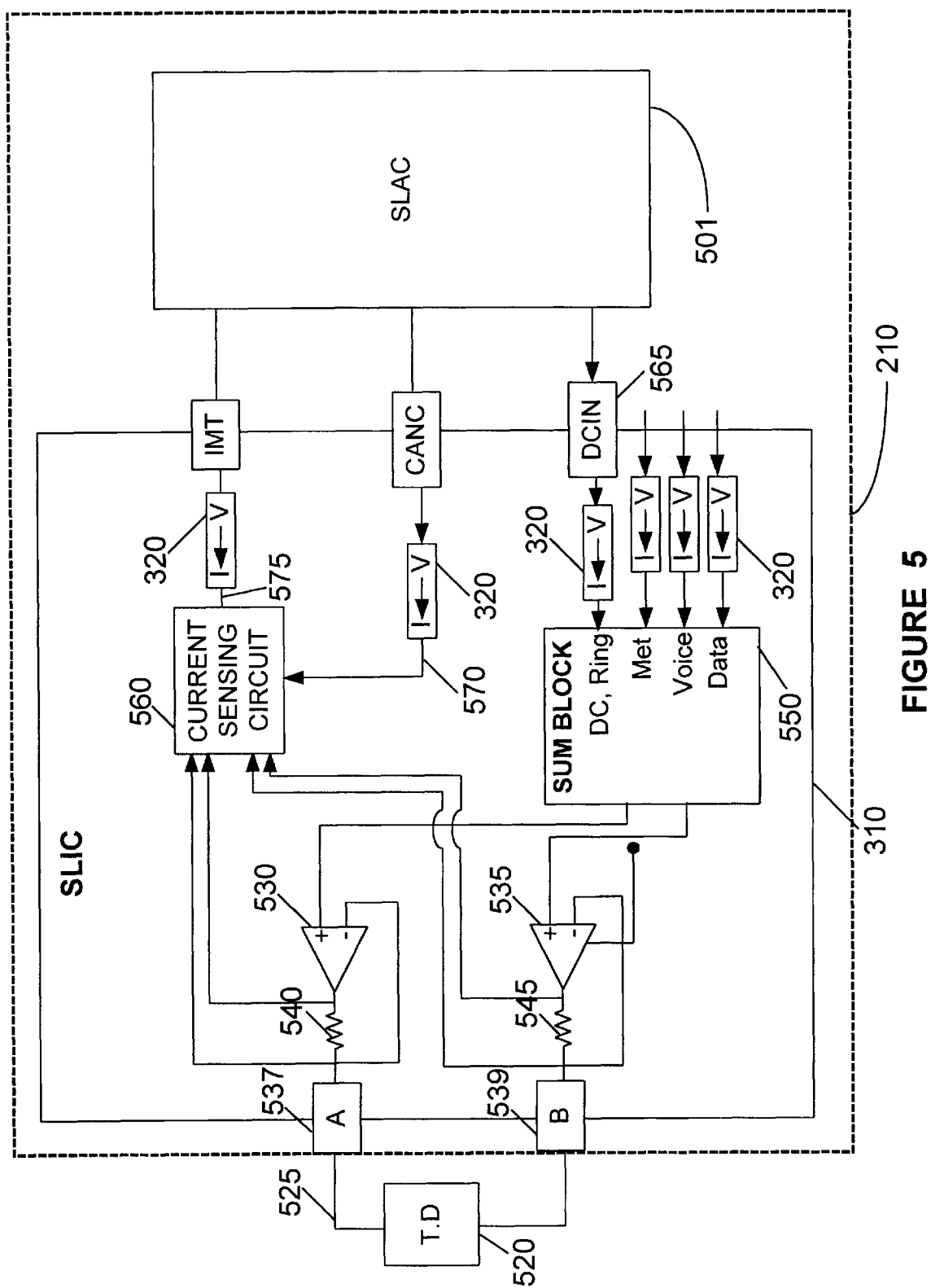
FIG. 5 illustrates a more detailed depiction of the SLIC, described in FIG. 3, in accordance with one embodiment of the present invention.

FIG. 5 illustrates one embodiment of a more detailed depiction of the SLIC 310 and an application of the voltage-to-current signal converter 320. The line card 210 typically includes at least one SLIC 310 as well as a subscriber line audio-processing circuit (SLAC) 501. The SLIC 310 is capable of performing a variety of functions, such as battery feed, overload protection, polarity reversal, on-hook transmission, current limiting, and the like. The SLIC 310 is connected to the SLAC 501. The SLAC 501 is capable of processing analog-to-digital (A/D) and digital-to-analog (D/A) signal conversion, filtering, feed control, supervision, and the like.

In one embodiment, the SLIC 310 is a voltage-feed SLIC 310. The voltage-feed SLIC 310 is a high voltage bipolar SLIC that drives voltages to a telephone line 525 and senses current flow in the telephone line 525. Therefore, a plurality of voltage signals arrive and depart to and from the SLIC 310. Generally, to reduce power losses due to signal propagation, the SLIC transmits and receives voltage-based signals. However, to reduce noise problems, such as distortion, the voltage-based signals are converted to current-based signals before being processed. In one embodiment, the SLIC 310 uses the voltage-to-current signal converter 320 to convert voltage signals into current signals for processing. There are distinct advantages of processing current signals instead of voltage signals in communication circuits. One such advantage of processing current signals is a reduction in distortion in processed signals.

The SLIC 310 includes first and second differential line drivers 530, 535 that interface with the telephone line 525 via tip and ring terminals 537, 539. The telephone line 525 is coupled with a telephonic device 520. The term "telephonic device," as utilized herein, includes a telephone, or any other device capable of providing a communication link between at least two users. The tip terminal 537 is coupled to a first terminal of a first sensing resistor ($R_{ab}$) 540 and to an inverting terminal of the first line driver 530. A second terminal of the first sensing resistor 540 is coupled to an output terminal of the first line driver 530. The ring terminal 539 is coupled to a first terminal of a second sensing resistor ($R_{bd}$) 545 and to an inverting terminal of the second line driver 535. A second terminal of the second sensing resistor 545 is coupled to an output terminal of the second line driver 535.

The SLIC 310 includes a sum block 550 and a current-sensing circuit 560. The sum block 550 includes a first output terminal coupled to a non-inverting terminal of the first line driver 530, and a second (inverted) output terminal coupled to a non-inverting terminal of the second line driver 535. The sum block 550 is capable of receiving a DC feed signal (as well as metering and ringing signals) from a DCIN terminal 565, a voice signal, a metering signal, and a data signal and is capable of adding one or more of the received signals and providing the summed signal to the first and second line drivers 530, 535. The conversion of the voltage signal to a current signal can be utilized by the current sensing circuit 560.

In one embodiment, the signal from the DCIN terminal 565 is converted to a current signal and is low-pass filtered. The current-sensing circuit 560 produces a current proportional to the current passing through the current sensing resistors 540, 545, subtracts a current proportional to a current from a cancellation terminal (CANC) 570, and provides the resulting current to an IMT terminal 575 of the SLIC 310. Although not so limited, in the instant embodiment, the constant of proportionality for the current from the cancellation terminal (CANC) 570 is unity, and the constant of proportionality for the line current is 0.001. Those skilled in the art will appreciate that only those portions of the SLIC 310 deemed relevant to the invention are disclosed herein. The SLIC 310 may employ resistors or other circuitry that is not illustrated in FIG. 5.

Although the SLIC 310 illustrated in FIG. 5 is a voltage-feed SLIC in which a voltage is applied to the subscriber loop and a resulting current is measured, it is contemplated that a current-feed SLIC may also be utilized in the line card 210 in accordance with the instant invention. In a current-feed SLIC, a current is fed to the subscriber loop and the measured electrical parameter is the resulting voltage.

Figure 6:
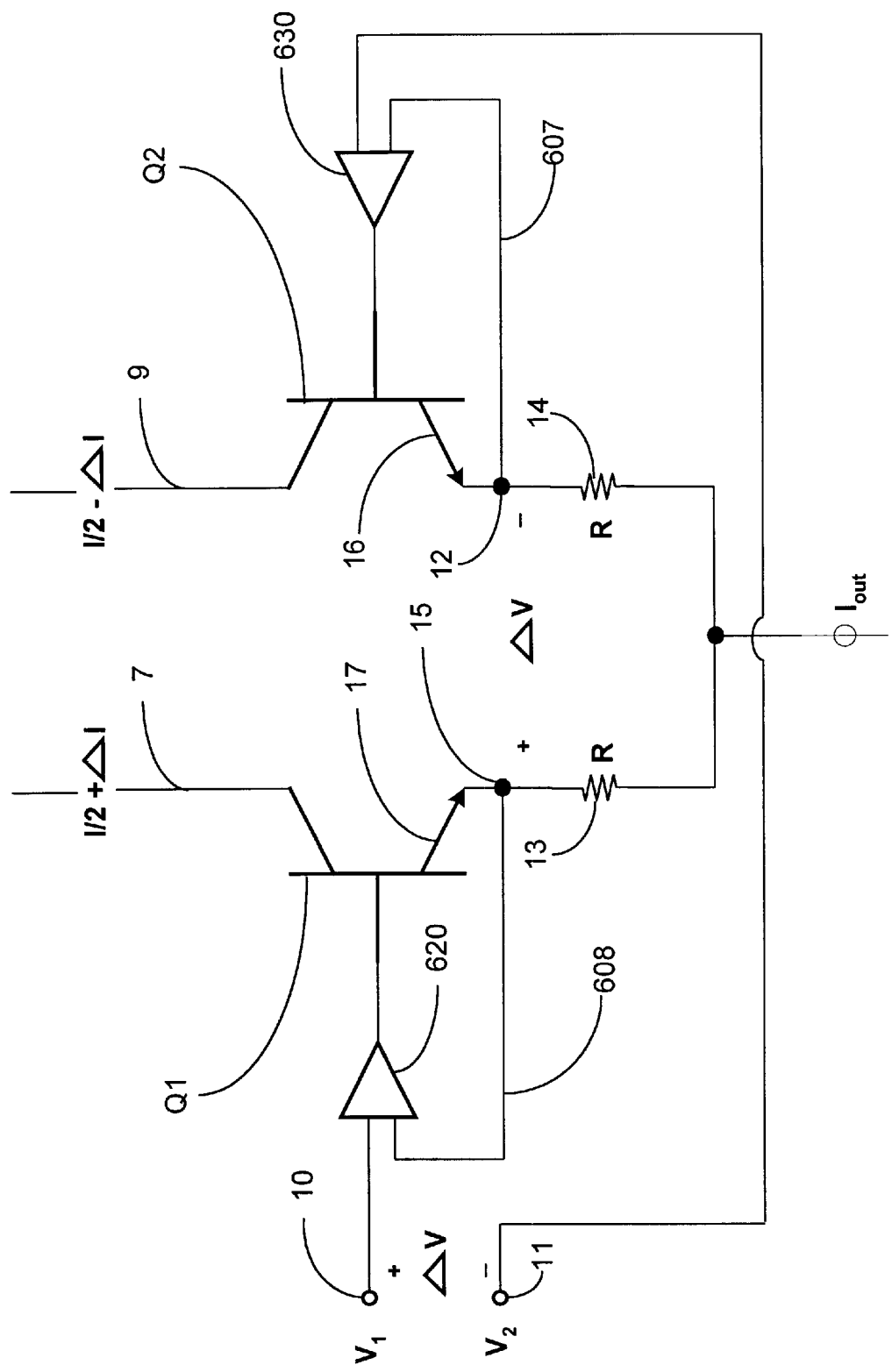
FIG. 6 illustrates a circuit for converting a voltage signal to a current signal, in accordance with one embodiment of the present invention.

Turning now to FIG. 6, one embodiment of the circuitry in accordance with the present invention is illustrated. The circuit illustrated in FIG. 6 comprises a differential circuit that converts an input voltage $V_1$, into an output current, $I_{out}$. The circuit illustrated in FIG. 6 comprises two amplifiers 620, 630. In one embodiment the amplifiers 620, 630 are operational amplifiers. In alternative embodiments, the amplifiers 620, 630; the transistors Q1, Q2, which can be bipolar junction transistors (BJT); and the resistors 13, 14, can be implemented in an integrated circuit. In an alternative embodiment, the transistors Q1, Q2 can be junction field effect transistors (JFET). In yet another alternative embodiment, the transistors Q1, Q2 can be metal-oxide semiconductor field effect transistors (MOSFET). In one embodiment, the lines 7 and 9 are coupled to a voltage source, such as reference voltage source.

The difference between the voltage level at nodes 10 and 11 is the differential voltage $\Delta V$. The differential voltage, $\Delta V$, can be defined by the equation:

$$\Delta V = V_1 - V_2.$$

The utilization of amplifiers 620, 630 reduces the effect of emitter resistors $R_{eQ1}$, $R_{eQ2}$ (not shown), which exists at the emitters 17, 18 of the transistors Q1, Q2. Utilizing the feedback amplifier taught by the present invention, the voltage effects caused by the emitter resistors, $R_{eQ1}$, $R_{eQ2}$, are substantially reduced. Therefore the non-linearities that are typically present in solid-state circuitry, such as transistors, are significantly reduced.

The reduction of non-linearity of the transistors Q1, Q2 is, in one embodiment, achieved by a feedback mechanism into the amplifiers 620, 630. The signal voltage at the emitter, (i.e., the signal voltage at node 15), can be defined by the equation $$\text{Voltage at Emitter}(Q1) = V_1 - V_{eQ1},$$

where $V_{eQ1}$ is the voltage induced by the emitter resistor $R_{eQ1}$. Similarly, the voltage at node 16 can be defined by the equation $$\text{Voltage at Emitter}(Q2) = V_2 - V_{eQ2},$$

where $V_{eQ2}$ is the voltage at the emitter 16 of the transistor Q2. The emitter voltage is generally induced by the emitter resistance $R_{eQ2}$. When the voltage at node 15 is fed back into the amplifier 620, the effect of the emitter resistance $R_{eQ1}$ upon the voltage at node 15 is substantially reduced. The signal at node 15 is fed back to the amplifier 620 via a line 608. Similarly, the feedback path on a line 607 that feeds the signal on node 12 into the amplifier 630 substantially reduces the effect of the emitter resistance $R_{eQ2}$ upon the voltage at node 12.

When the effects of the emitter resistance $R_{eQ1}$, $R_{eQ2}$ are substantially reduced, the output current $I_{out}$, behaves substantially like the signal defined by the following equation:

$$I_{out} = \Delta V/2 * R.$$

Due to the feedback mechanism provided by the present invention, the voltage levels at nodes 15 and 12 remain substantially close to the voltage levels $V_1$, and $V_2$, respectively. Therefore, the voltage difference between nodes 15 and 12 is substantially equal to the differential voltage $\Delta V$, resulting in $I_{out}$ being equal to $\Delta V2 * R$.

Using the techniques described by embodiments of the present invention, the value of the signals that are converted by the circuit illustrated in FIG. 6, can be a small-level signal and still maintain an acceptably low noise level. Using the circuitry illustrated in FIG. 6, the equation $$I_{out} = \Delta V/2 * R,$$

can be realized.

By implementing the feedback amplifiers 620, 630, the maximum voltage-level possible for non-saturated operation of the circuit in FIG. 6, which results in a maximum differential voltage, $\Delta V_{max}$, can be used for signal conversion. Therefore, the circuit illustrated in FIG. 6 can operate near the saturation rails and still produce converted current signals with reduced noise levels.

Figure 7:
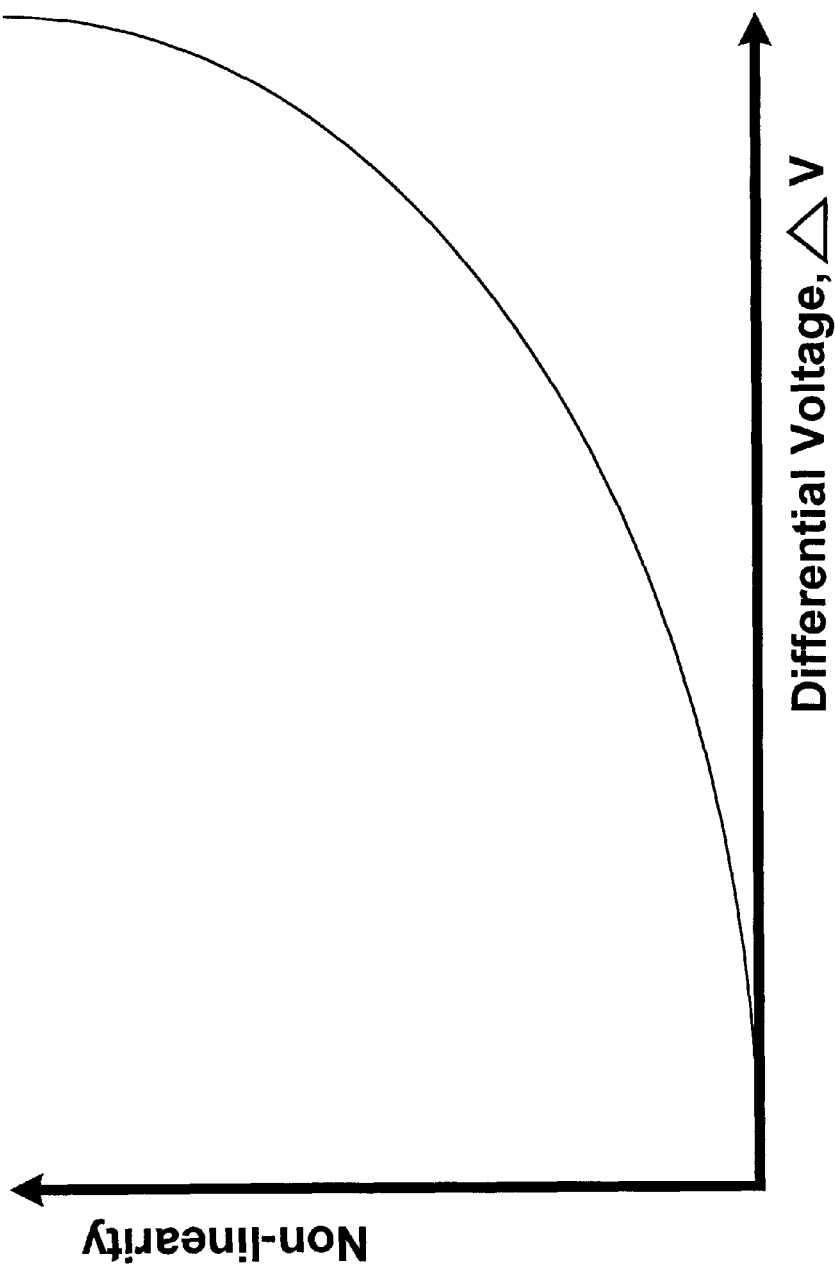
FIG. 7 depicts a graph that illustrates the relationship between a differential voltage and the non-linearity of a voltage-to-current signal conversion circuit.

Referring to FIG. 7, a graph that illustrates the non-linearity effects of solid-state devices, such as transistors, in relation to differential voltage, is shown. As the differential voltage $\Delta V$ increases, the non-linear effects of the transistor also increase, causing significant loss of signal integrity. Using conventional methods, operating a signal-conversion circuit at the saturation rails can result in an increased differential voltage, which may result in greater non-linearity. Generally, the higher the non-linearity in the operation of a circuit, the greater the error in the output signals. However, utilizing the methods taught by the embodiments of the present invention, the maximum differential voltage $\Delta V_{max}$, which can result when a signal conversion circuit is operated near saturation rails, may not cause significant loss in signal integrity. Non-linearity can cause an error that can become a significant percentage of a small-level signal. The amplifiers illustrated in FIG. 6 reduce non-linearity during the operation of the circuit. Therefore, small-level signals can be converted by the conversion circuit illustrated by FIG. 6 without compromising signal quality. Thus, utilizing the embodiments taught by the present invention, the non-linear effects illustrated in FIG. 7 are reduced. The concepts taught by embodiments of the present invention can be utilized in a variety of electronic applications.

The apparatuses 110, 120, 130 can be integrated in a system capable of transmitting and receiving signals having a voice band and a data band. The teachings of the present invention may be implemented in a line card 210 that supports both POTS and ADSL technologies.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
   a differential circuit to convert a voltage signal into a current signal, said differential circuit comprising at least one transistor and a feedback amplifier, said amplifier being used in a negative feedback configuration using an emitter node of said transistor to reduce non-linearity in said differential circuit.

2. The apparatus of claim 1, wherein said differential circuit comprises a plurality of transistors coupled to form a differential circuit.

3. The apparatus of claim 2, wherein said transistors are bipolar junction transistors (BJT).

4. The apparatus of claim 2, wherein said transistors are junction field effect transistors (JFET).

5. The apparatus of claim 2, wherein said transistors are metal oxide semiconductor field effect transistors (MOSFET).

6. The apparatus of claim 2, wherein said feedback amplifier receives an input voltage signal that is converted into a current signal.

7. The apparatus of claim 6, wherein an output of said feedback amplifier is coupled with a base associated with at least one of said transistors.

8. The apparatus of claim 7, wherein said feedback amplifier receives a negative feedback from an emitter associated with at least one of said transistors.

9. The apparatus of claim 8, wherein said negative feedback into said feedback amplifier reduces the effect of an emitter resistance associated with at least one of said transistors.

10. The apparatus of claim 9, wherein said differential circuit comprises a resistor coupled in series with said emitter of at least one of said transistors.

11. A method comprising:
converting at least one voltage signal into a current signal using a differential circuit comprising a plurality of transistors; and
performing a feedback using a feedback amplifier in a negative feedback configuration using an emitter node of at least one of said transistors to reduce non-linearity of said transistors during said conversion of said voltage signal.

12. The method of claim 11, wherein performing said feedback using said feedback amplifier further comprises performing a negative feedback of an emitter signal associated with at least one of said transistors in the differential circuit to reduce an effect of a emitter resistance.

13. The method of claim 11, wherein performing said feedback using said feedback amplifier further comprises coupling an output of said feedback amplifier into a base of at least one of said transistors in said differential circuit.

14. An apparatus, comprising:
means for converting at least one voltage signal into a current signal using a differential circuit comprising a plurality of transistors; and
means for performing a feedback using a feedback amplifier in a negative feedback configuration using an emitter node of at least one of said transistors to reduce non-linearity of said transistors during said conversion of said voltage signal.

15. An apparatus, comprising:
a first transistor having a first terminal coupled to a voltage source and a second terminal coupled to a current output terminal through a first resistor;
a first amplifier having a first and second input terminals and an output terminal, the output terminal being coupled to a control terminal of the first transistor, the first input terminal being coupled to receive an input voltage, the second input terminal being coupled to the second terminal of the first transistor;
a second transistor having a first terminal coupled to the voltage source and a second terminal coupled to a current output terminal through a second resistor; and
a second amplifier having a first and second input terminals and an output terminal, the output terminal being coupled to a control terminal of the second transistor, the first input terminal being coupled to receive an input voltage, the second input terminal being coupled to the second terminal of the second transistor.

16. The apparatus of claim 15, wherein said first transistor and said second transistor are coupled to form a differential circuit.

17. The apparatus of claim 15, wherein said first resistor and said second resistor are approximately equal to each other.

* * * * *

UNITED STATES PATENT AND TRADEMARK OFFICE
CERTIFICATE OF CORRECTION

PATENT NO.    : 6,628,534 B2                                                Page 1 of 1
DATED         : September 30, 2003
INVENTOR(S)   : Roger K. Benton It is certified that error appears in the above-identified patent and that said Letters Patent is hereby corrected as shown below:

Column 1,
Line 27, replace "modem" with -- modern --.

Signed and Sealed this

Eighteenth Day of November, 2003

JAMES E. ROGAN
*Director of the United States Patent and Trademark Office*